United States Patent [19]

Pfleiderer et al.

[11] 3,987,313

[45] Oct. 19, 1976

[54] ARRANGEMENT FOR THE GENERATING OF PULSE TRAINS FOR CHARGE-COUPLED CIRCUITS

[75] Inventors: Hans-Jöerg Pfleiderer, Zorneding; Karl Knauer, Gauting, both of Germany

[73] Assignee: Siemens Aktiengesellschaft, Berlin & Munich, Germany

[22] Filed: Dec. 30, 1974

[21] Appl. No.: 537,073

[30] Foreign Application Priority Data

Jan. 15, 1974 Germany............................ 2401781

[52] U.S. Cl. ............................... 307/221 R; 328/37; 328/43; 307/262
[51] Int. Cl.² ..................... H03K 21/00; H04B 1/00
[58] Field of Search ........... 307/221, 262, 269, 289; 328/43, 49, 42, 539

[56] References Cited
UNITED STATES PATENTS

| | | | |
|---|---|---|---|
| 3,471,790 | 10/1969 | Kaps | 307/269 X |
| 3,518,552 | 6/1970 | Carlow | 307/221 |
| 3,541,356 | 11/1970 | Lagemann | 307/289 |
| 3,745,535 | 7/1973 | DeKoe et al. | 307/221 |
| 3,786,276 | 1/1974 | Rosch | 307/289 |

Primary Examiner—Stanley D. Miller, Jr.
Assistant Examiner—B. P. Davis
Attorney, Agent, or Firm—Hill, Gross, Simpson, Van Santen, Steadman, Chiara & Simpson

[57] ABSTRACT

An arrangement for generating pulse trains for charged-coupled circuits employs a plurality of series-connected master-slave JK flip-flop circuits in which a Q output of a flip-flop circuit is connected to a J input of the following flip-flop circuit and in which a terminal for obtaining the generated timing pulses is provided at each Q output of a flip-flop circuit. A pulse train input for providing timing pulses to the flip-flop circuits and for each flip-flop circuit an NAND gate is provided whose output is connected to the clear input of the flip-flop circuit. One input of the NAND gate is connected to the timing pulse input line and another input is connected to a Q output of the following flip-flop circuit, except for the last flip-flop circuit in which the other input of the NAND gate associated therewith is connected to the Q output of the first flip-flop circuit. The K inputs of the flip-flop circuits are connected to a fixed potential, preferably a common connection to ground, and the individual flip-flop circuits may be additionally set by way of the clear inputs. In one embodiment the arrangement is constructed for two-phase operation and in another embodiment the arrangement is constructed for three-phase operation.

6 Claims, 7 Drawing Figures

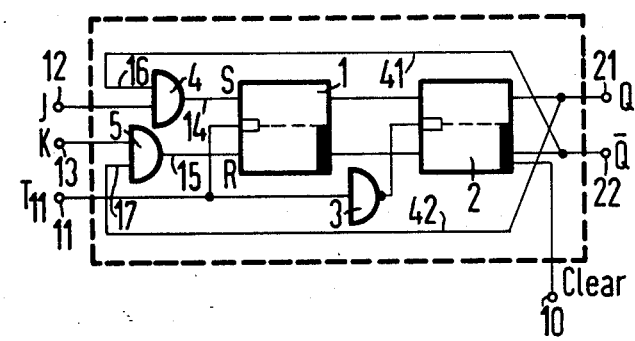
Fig.1 PRIOR ART
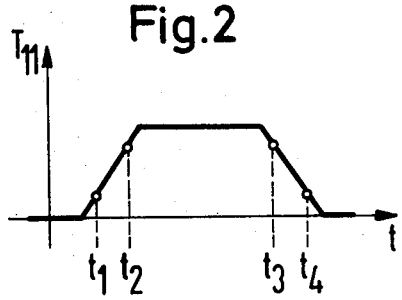
Fig.2
Fig.3
| $t_n$ | | $t_{n+1}$ |
|---|---|---|
| J | K | Q |
| 0 | 0 | $Q_n$ |
| 0 | 1 | 0 |
| 1 | 0 | 1 |
| 1 | 1 | $\bar{Q}_n$ |
Clear=0 → Q=0

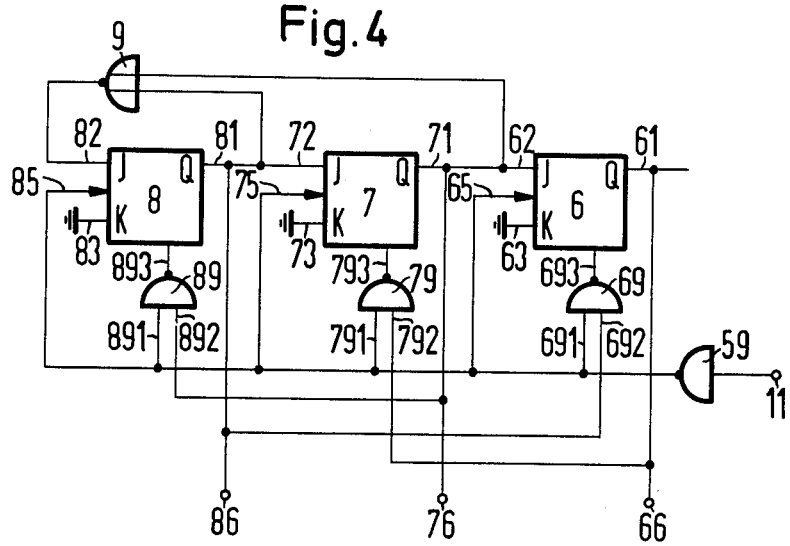
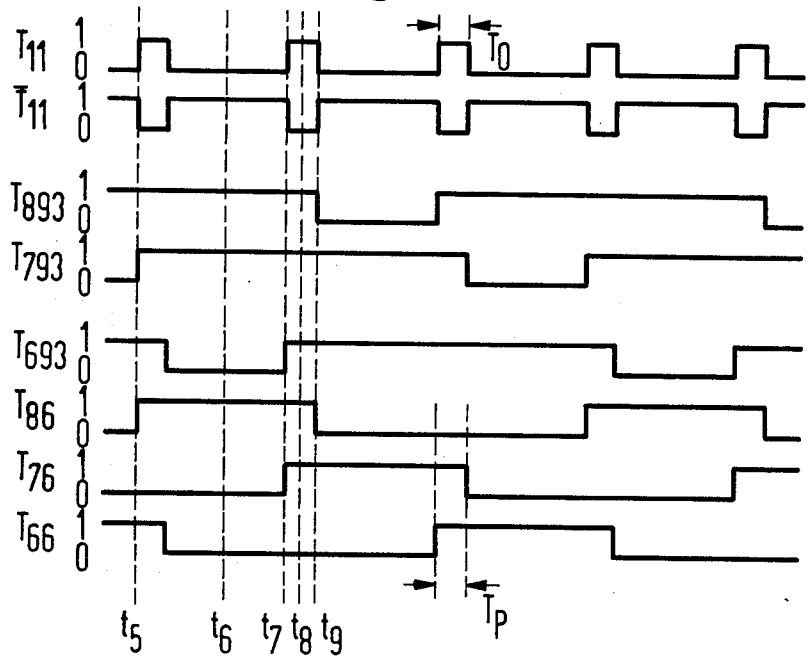

ARRANGEMENT FOR THE GENERATING OF PULSE TRAINS FOR CHARGE-COUPLED CIRCUITS

BACKGROUND OF THE INVENTION

1. Field of the Invention

This invention relates to an arrangement for the generation of pulse trains for charge-coupled circuits, and is more particularly concerned with an arrangement in which a series of JK flip-flops are employed for generating pulse trains for two-phase and three-phase operation of charge-coupled circuits.

2. Description of the Prior Art

In the publication "Charge-Coupled-Devices Fabricated Using Aluminum-Anodized Aluminum Double Level Metallization" by R. D. Collins et al, in the publication Journal of the Electrochemical Society, April 1973, Pages 521–526, an arrangement for the generation of pulse trains for charge-coupled circuits of four-phase operation is described in which, for the generation of pulse trains, JK flip-flops are used which have outputs which can be set, on the one hand, by way of the JK inputs and, on the other hand, by way of the clear inputs. In this arrangement each of the pulse trains Q1–Q4 which is produced is overlapped by the preceding and the following pulse train.

SUMMARY OF THE INVENTION

An object of the invention is to considerably simplify an arrangement, as described above for four-phase operation, for the generation of pulse trains, and to render it utilizable for the operation of charge-coupled elements for two-phase and three-phase operation.

This object is realized by an arrangement for pulse train generation which is particularly characterized in that the K inputs of a series of flip-flop circuits are commonly connected to a fixed potential, preferably ground potential, and that the individual flip-flop circuits may in each case be additionally set by way of the clear inputs.

A fundamental advantage of an arrangement constructed in accordance with the invention is that it can be constructed with commercially available logic modules.

Advantageously, the arrangements constructed in accordance with the invention are self-correcting, i.e. any fault which may occur in the pulse train is automatically eliminated.

BRIEF DESCRIPTION OF THE DRAWINGS

Other objects, features and advantages of the invention, its organization, construction and operation will be best understood from the following detailed description taken in conjunction with the accompanying drawings, on which:

FIG. 1 is a block diagram illustration of a JK master-slave flip-flop circuit;

FIG. 2 illustrates a pulse of a pulse train required for the control of a JK master-slave flip-flop circuit;

FIG. 3 is a truth table for the JK master-slave flip-flop illustrated in FIG. 1;

FIG. 4 is a block circuit diagram of an arrangement constructed in accordance with the invention for the generation of pulse trains for three-phase operation;

FIG. 5 is a pulse wave diagram for an arrangement constructed in accordance with the invention as illustrated in FIG. 4;

DESCRIPTION OF THE PREFERRED EMBODIMENTS

Prior Art Circuit

Figure 6:
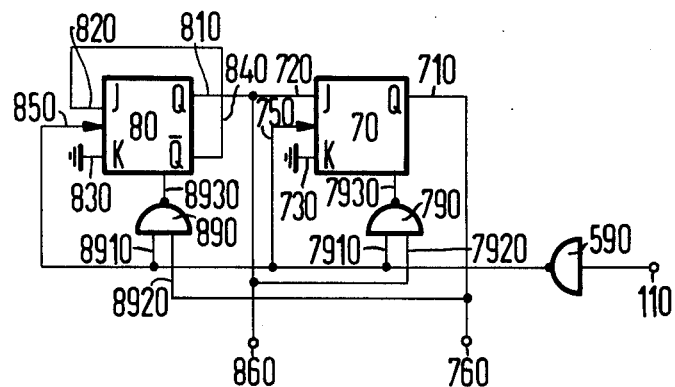
FIG. 6 is a block circuit diagram of an arrangement constructed in accordance with the invention for the pulse train generation for two-phase operation.

A known JK master-slave flip-flop circuit will first be described with reference to FIG. 1 for a clear understanding of the invention. Basically, the flip-flop circuit comprises a flip-flop 1 (master) and a flip-flop 2 (slave). The flip-flop 1 is triggered by the application of timing pulses $T_{11}$ which are applied to a pulse train input 11. The slave flip-flop 2 is triggered by the timing pulses $T_{11}$ which are inverted with the aid of an inverter 3.

FIG. 2 represents a timing pulse $T_{11}$. During the timing pulse $T_{11}$ the master flip-flop 1 receives the input data present at the inputs 14 (S) and 15 (R) at the time $t_2$. During the course of the falling trailing edge of the pulse, the inputs of the master flip-flop 1 are then blocked at the time $t_3$. Not until after the delay times of the pulse train inverter 3 is the output data of the master-flip-flop 1 accepted by the slave flip-flop 2 and appears at the output 21 (Q) at the time $t_4$. This operating division between the master and slave circuits ensures that the input 14 (S) or 15 (R) is blocked when the output 21 (Q) or 22 ($\overline{Q}$) switches. On the arrival of the next timing pulse, the input of the master flip-flop 1 is opened immediately on the rise in the pulse train at the time $t_2$, after the slave flip-flop 2 has been separated from the master flip-flop 1 at the time $t_1$.

As can also be seen from FIG. 1, the output 22 ($\overline{Q}$) is connected to the input 16 of an AND gate 4 by way of a feedback line 41. The second input 12 (J) of the AND gate 4 represents one input of the master-slave flip-flop circuit. The output 21 (Q) of the slave flip-flop 2 is connected to the input 17 of an AND gate 5 by way of another feedback line 42. The second input 13 (K) of the AND gate 5 represents a further input of the master-slave flip-flop circuit. This feedback connection ensures that the master-slave flip-flop circuit is triggered back into the opposite state with every falling trailing edge of the pulse if the suitable data is present at the inputs 12 (J) and 13 (K).

FIG. 3 illustrates the truth table of a JK master-slave flip-flop circuit. If the data 0 is present at the inputs 12 (J) and 13 (K) before the timing pulse $T_{11}$, the data $Q_n$ is present at the output 21 (Q) after the timing pulse $T_{11}$ and in fact was also present at this output before the timing pulse $T_{11}$.

If before the timing pulse $T_{11}$ the data 0 is present at the input 12 (J) and the data 1 is present at the input 13 (K), then the data 0 will be present at the output 21 (Q) after the timing pulse $T_{11}$.

If before the timing pulse $T_{11}$ the data 1 is present at the input 12 (J) and the data 0 is present at the input 13 (K), then the data 1 is present at the output 21 (Q) after the timing pulse $T_{11}$.

If the data 1 is present at the inputs 12 (J) and 13 (K) before the timing pulse $T_{11}$, then the data $\overline{Q}_n$ which was present at the output 22 ($\overline{Q}$) before the timing pulse $T_{11}$ is present at the output 21 (Q) after the timing pulse $T_{11}$.

The present invention is based on the following considerations. The operation of charge-coupled circuits for three-phase operation requires individual pulse train voltages, and an overlap $T_p$ of the individual pulse train voltages must be ensured. The publication described above with respect to the description of the prior art sets forth a logic circuit with the aid of which these pulse train voltages are generated for charge-coupled elements for four-phase operation. The basic idea is to employ for pulse train generation JK master-slave flip-flops whose outputs can be set, on the one hand, by way of the JK inputs and, on the other hand, through the clear inputs. For charge-coupled elements for two-phase or three-phase operation, a circuit for pulse train generation in accordance with the invention is provided in which the output of a conventional JK master-slave flip-flop can be additionally set by means of the pulse train input (clear input). Also in accordance with the invention, only one input, namely the J input of the JK master-slave flip-flop is employed. As shown in the truth table of FIG. 3, if the input 13 (K) is grounded (K = 0) the output 21 (Q) can be set (Q = 1) by a logic 1 at the input 12 (J). If now the inputs 12 (J) is changed (J = 0), the output does not change its state (Q = $Q_n$). The output can only be influenced by way of the clear input 10. If in fact the data 0 is present at the clear input 10, at the output 21 (Q) a 0 will consequently also be set.

Three-Phase Operation

Referring to FIG. 4, an arrangement constructed in accordance with the invention is illustrated for the generation of pulse trains having pulse train voltages $Q_1$, $Q_2$ and $Q_3$ which are required for the operation of a charge-coupled circuit for three-phase operation. The mode of operation is disclosed in the pulse wave form diagram of FIG. 5.

The arrangement constructed in accordance with the invention for pulse train generation for three-phase operation as illustrated in FIG. 4 basically comprises three JK master-slave flip-flops 6, 7 and 8, three negating AND gates 69, 79 and 89, a negator or inverter 59 and a negating OR gate 9. The K inputs 63, 73 and 83 of the individual flip-flops 6, 7 and 8 are in each case preferably connected to ground potential (data 0). The Q output 81 of the flip-flop 8 is connected to the J input 72 of the flip-flop 7, and the Q output 71 of the flip-flop 7 is connected to the J input 62 of the flip-flop 6.

Preferably, the Q output 81 of the flip-flop 8 and the Q output 71 of the flip-flop 7 are fed back by way of the negating OR gate 9 to the J input 82 of the flip-flop 8.

The timing pulses $T_{11}$ are present at the input 11. The timing pulses $T_{11}$ are inverted by the inverter 59 to provide inverted timing pulses $\overline{T}_{11}$. The pulse train $\overline{T}_{11}$ is fed by way of the pulse train inputs 65, 75 and 85 to the flip-flops 6, 7 and 8, and in addition the pulse train $\overline{T}_{11}$ is in each case fed to one of the inputs of the negating AND gates 69, 79 and 89. Here, the output 693 of the gate 69 is connected to the clear input of the flip-flop 6, the output 793 of the gate 79 is connected to the clear input of the flip-flop 7, and the output 893 of the gate 89 is connected to the clear input of the flip-flop 8. The second input 692 of the gate 69 is connected to the output 81 of the flip-flop 8, the second input 792 of the gate 79 is connected to the output 61 of the flip-flop 6, and the second input 892 of the gate 89 is connected to the output 71 of the flip-flop 7.

The timing pulses $Q_3$, $Q_2$ and $Q_1$ are present at the outputs 66, 76 and 86 taken from the Q outputs of the flip-flops 6, 7 and 8, respectively.

As mentioned above, the K inputs are connected to a reference potential, preferably ground potentials. Also, the K inputs are preferably connected to each other.

The mode of operation of the arrangement constructed in accordance with FIG. 4 will be explained below and will be discussed with reference to the pulse wave form diagram in FIG. 5. It is first assumed that the timing pulses $T_{11}$ are present at the input 11, and that as a result the timing pulses $\overline{T}_{11}$ are present at the output of the inverter 59 and at the pulse train inputs 65, 75 and 85 of the flip-flops 6, 7 and 8, and at the inputs 691, 791 and 891 of the negating AND gates 69, 79 and 89. At the time $t_5$, the data Q = 1 is present at the output 81 of the flip-flop 8. This data is likewise present at the output 86 and represents the first pulse train $Q_1$.

In the period of time which now follows, for example at the time $t_6$, $Q_1 = 1$ is present at the output 81, $Q_2 = 0$ is present at the output 71 and $Q_3 = 0$ is present at the output 61. At the same time $T_{11} = 0$ and $\overline{T}_{11} = 1$. The data 0 is present at the J input 82 of the flip-flop 8, which means that the flip-flop 8 does not change its output state on the transition of $\overline{T}_{11}$ to 0 at the time $t_7$. The flip-flop 7, on the other hand, having the data $Q_1 = 1$ present at its J input 72, changes its state when $\overline{T}_{11}$ passes to 0 so that the data $Q_2 = 1$ is present at its output 71. Consequently, at the time $t_8$, $Q_1 = 1$, $Q_2 = 1$ and $\overline{T}_{11} = 0$.

Until now, the data 1 was present at the clear input 893 of the flip-flop 8, which means that this clear input 893 does not exert any influence. If, however, the pulse train $\overline{T}_{11}$ changes its state so that at the time $t_9$ $\overline{T}_{11} = 1$, the clear input 893 of the flip-flop 8 is set at 0. This means that the data 0 is likewise present at the output 81 of the flip-flop 8. Therefore, the time $T_0$, as can also be seen from FIG. 5, determines the overlap time $T_p$ of the first and second timing pulses. The aforementioned processes now take place cyclically interchanged, which means that the output of the preceding flip-flop sets the output of the flip-flop in question to a logic 1 whenever the pulse train $\overline{T}_{11}$ passes to 0. The pulse train $\overline{T}_{11}$ then passes to 1 and the data 0 is present at the clear input of the preceding flip-flop by way of one of the AND gates 69, 79, 89 which means that the data 0 is likewise present at the output of the preceding flip-flop.

The feedback of the output 81 of the flip-flop 8 and of the output 71 of the flip-flop 7 and, therefore, of the pulse trains $Q_1$ and $Q_2$ ensures that J = 1 when and only when $Q_1$ and $Q_2$ are 0 at the same time. Therefore, this feedback results in the fact that, apart from the overlap times, only one of the pulse train outputs 66, 76 and 86 ever exhibits a logic 1 and a fault is automatically corrected during the entire period.

Two-Phase Operation

Figure 7:
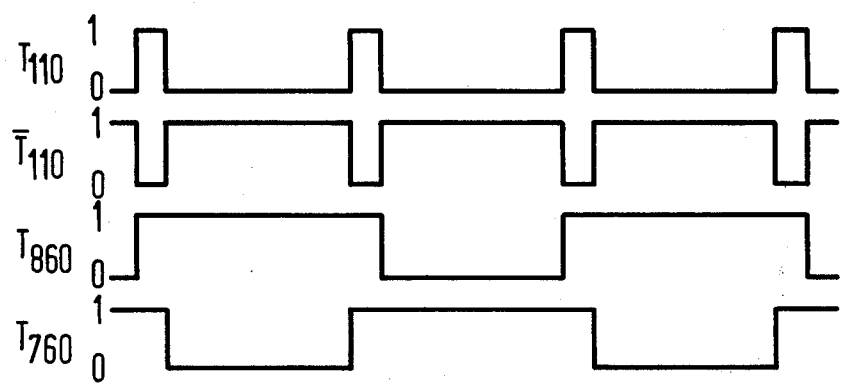
FIG. 7 is a pulse wave diagram of an arrangement constructed in accordance with the invention, as illustrated in FIG. 6.

The arrangement constructed in accordance with the invention as illustrated iN FIG. 6 serves to generate pulse trains for charge-coupled circuits for two-phase operation, and functions in the same way as the circuit for three-phase operation illustrated in FIG. 4. It basically comprises two JK master-slave flip-flops 80 and 70 and a pair of negating AND gates 790 and 890. The timing pulses $T_{110}$ present at the pulse train input 110 are inverted by an inverter 590 and are present as timing pulses $\overline{T}_{110}$ at the pulse train inputs 850 and 750 of the flip-flops 80 and 70. The output of an inverting AND gate 890 is connected to the clear input 8930 of the flip-flop 80. The timing pulses $\overline{T}_{110}$ are present at the one input 8910 of this inverting AND gate. The other input of the inverting AND gate is connected to the Q output 710 of the flip-flop 70. The output of the inverting AND gate 790 is connected to the clear inputs 7930 of the flip-flop 70. The timing pulses $\overline{T}_{110}$ are present at the one input 7910 of this AND gate. The other inputs 7920 of the AND gate 790 is connected to the Q output 810 of the flip-flop 80. The K inputs 830 and 730 of the flip-flops 80 and 70 carry a fixed potential, preferably ground potential. The $\overline{Q}$ output of the flip-flop 80 is fed back to the J input 820 of the flip-flop 80 by way of a connection 840. The output timing pulses $T_{860}$ and $T_{760}$ which represent the desired signals $Q_1$ and $Q_2$ for the operation of a charge-coupled circuit for a two-phase operation, and which are illustrated in FIG. 7, are present at the terminals 860 and 760.

Although we have described our invention by reference to particular preferred embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An arrangement for generating pulse trains for charge coupled circuits, comprising:
    a plurality of JK master-slave flip-flop stages each including a J input, a K input, a trigger input, a clear input and a Q output, said stages connected in a series chain in which the Q output of each stage preceding the last stage of the chain is connected to the J input of the following stage of the chain;
    a timing pulse train input connected to said trigger input of each stage for supplying timing pulses of a predetermined pulse width thereto; and
    a plurality of NAND gates each including an output connected to said clear input of a respective stage, a first input connected to said timing pulse train input, and a second input connected to said Q output of the following stage with said second input of the NAND gate associated with the last stage connected to said Q output of the first stage of the chain,
    each of said K inputs connected to a common reference potential, wherein said stages are responsive to set conditions at said clear inputs to generate phase output pulses at said Q outputs which overlap by said predetermined width of the timing pulses applied to said NAND gates.

2. An arrangement according to claim 1, comprising an inverter connected to said timing pulse train input for providing the timing pulses from inverted pulses.

3. An arrangement according to claim 1, wherein said plurality of JK master-slave flip-flop stages comprises three stages for pulse-train generation for three-phase operation.

4. An arrangement according to claim 3, comprising a NOR gate including an output connected to said J input of the first stage of the chain, a first input connected to said Q output of the first stage and a second input connected to said Q output of the second stage.

5. An arrangement according to claim 1, wherein said plurality of JK master-slave flip-flop stages comprises two stages for pulse train generation for two-phase operation.

6. An arrangement according to claim 5, wherein the first stage includes a $\overline{Q}$ output connected to the J input of the first stage.

* * * * *